(12) United States Patent
Ueno

(10) Patent No.: US 6,323,992 B1
(45) Date of Patent: Nov. 27, 2001

(54) WAVELENGTH CONVERTER AND WAVELENGTH CONVERSION METHOD

(75) Inventor: Yoshiyasu Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/342,445

(22) Filed: Jun. 29, 1999

(30) Foreign Application Priority Data

Jun. 29, 1998 (JP) .................................................. 10-182652

(51) Int. Cl.[7] .................................................... G02F 1/365

(52) U.S. Cl. ........................... 359/332; 359/326; 385/122
(58) Field of Search ................................... 359/326–332; 385/122

(56) References Cited

U.S. PATENT DOCUMENTS 5,786,930 * 7/1998 Takatsu et al. ...................... 359/331

FOREIGN PATENT DOCUMENTS

| 5-02197 | 1/1993 | (JP) . |
| 7-13208 | 1/1995 | (JP) . |
| 7-20510 | 1/1995 | (JP) . |
| 7-199240 | 8/1995 | (JP) . |
| 8-179385 | 7/1996 | (JP) . |
| 8-254725 | 10/1996 | (JP) . |
| 9-90440 | 4/1997 | (JP) . |
| 10-301151 | 11/1998 | (JP) . |
| 10-319448 | 12/1998 | (JP) . |

OTHER PUBLICATIONS

Japanese Journal of Applied Physics, vol. 32, pp. L1746–L1749, (Dec.) 1993.
Nakamura et al., Applied Physics Letters, vol. 65, pp. 283–285, (Jul.) 1994.
Applied Physics Letters, vol. 67, pp. 3709–3711, (Dec.) 1995.
IEEE Photonics Technology Letters, vol. 8, pp. 1695–1697, (Dec.) 1996.
IEEE Photonics Technology Letters, vol. 10, pp. 346–348, (Mar.) 1998.
Journal of Lightwave Technology, vol. 14, pp. 942–954, (Jun.) 1996.
The technical digest of the Second Workshop of Research Group for Optical Soliton Communications, pp. 1–38, Apr. 8, 1997.

(List continued on next page.)

Primary Examiner—John D. Lee

(57) ABSTRACT

To a first nonlinear waveguide and a second nonlinear waveguide each having a refractive index which varies in response to the input of an optical signal, input optical signal pulses are inputted together with continuous light of a predetermined wave length said input optical signal pulses being caused to have a time delay corresponding to 0.6~1.2 times the pulse width of said input optical signal pulses. Then, the phase of an optical signal outputted from the second nonlinear waveguide is adjusted to a predetermined amount with respect to the phase of an optical signal outputted from the first nonlinear waveguide, and the optical signal outputted from the first nonlinear waveguide and an output signal outputted from the second nonlinear waveguide are coupled, whereafter a wavelength component of the input optical signal pulse is removed from the coupled optical signal. Consequently, an output optical signal pulse of a wavelength different from that of the input optical signal pulse can be obtained while little wavelength chirping is generated.

30 Claims, 15 Drawing Sheets

OTHER PUBLICATIONS

The extended abstracts of the 58$^{th}$ Autumn Meeting of Japan Society of Applied Physics, No. 3, p. 1138, Oct., 1997, 5a–zB 6.

The extended abstracts of the 45$^{th}$ Spring Meeting of the Japan Society of Applied Physics and Related Societies, No. 3, p. 1135, Mar., 1998, 29a–SZL–17.

Applied Physics Letter, vol. 67, No. 17, pp. 2445–2447, (Oct.) 1995.

1997 (9$^{th}$ year of Heisei) 44$^{th}$ Spring Applied Physics Associates Lecture, Preliminary Draft, vol. 3 (Published Mar. 28, 1997) p. 979, Shigeru Nakamura, et al., 29p–NC–12.

IEEE Photonics Technology Letters, vol. 8, No. 12, pp. 1695–1697, (Dec.) 1996.

* cited by examiner

Δt=0.80ps
Δt/ΔT=0.40

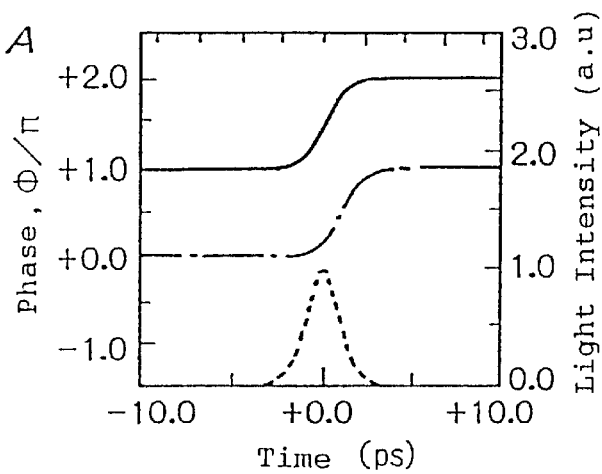
F I G. 6A
Δt = 1.00 ps
Δt/ΔT = 0.50
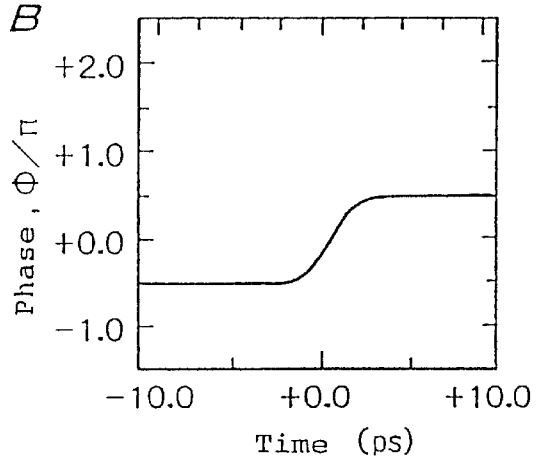
F I G. 6B
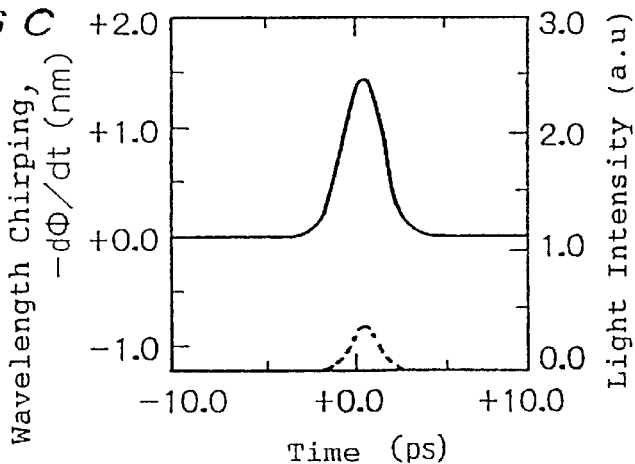
F I G. 6C Δt=1.20ps
Δt/ΔT=0.60

| Arrival Time difference (ps) | Pulse width of output signal (ps) | Wavelength Chirping (nm) |
|---|---|---|
| 0.20 | 1.383 | — |
| 0.40 | 1.408 | — |
| 0.80 | 1.505 | 0.384 |
| 1.00 | 1.578 | 0.360 |
| 1.20 | 1.67 | 0.284 |
| 1.78 | 2.00 | 0.060 |
| 2.00 | 2.17 | 0.100 |
| 2.40 | 2.49 | 0.256 |
| 3.20 | 3.22 | 0.50 |
| 10.0 | 9.97 | — |

WAVELENGTH CONVERTER AND WAVELENGTH CONVERSION METHOD

BACKGROUND OF THE INVENTION

1. Field of the Invention

This invention relates to a wavelength converter suitable for use for wavelength-division-multiplexing (WDM) optical communication.

2. Description of the Related Art

In recent years, WDM optical communication has been put into practical use as a large-capacity optical communication system. In WDM optical communication, a plurality of optical signals of different wavelengths are multiplexed, and communication channels are allocated individually to the multiplexed wavelengths. For WDM optical communication in the future, implementation of an optical switching function for switching information between arbitrary communication channels is being investigated, and various wavelength converters such as those described below have been proposed.

For example, Tajima et al. have proposed a symmetric Mach-Zehnder type all-optical switch including a Mach-Zehnder type interferometer (Japanese Patent Laid-Open No. 20510/1995 or Japanese Journal of Applied Physics, Vol. 32, pp.L1746–L1749, 1993). While the symmetric Mach-Zehnder type all-optical switch disclosed in the documents has been proposed for design a demultiplexer, since an output pulse of wavelength light different from that of an input pulse can be obtained (Nakamura et al., Applied Physics Letters, Vol. 65, pp.283–285, 1994), it can be used also as a wavelength converter (hereinafter referred to as first prior art). Tajima et al. have further proposed a polarization-discriminating type all-optical switch which is an improved apparatus of the first prior art and is higher in stability (Applied Physics Letters, Vol. 67, pp.3709–2711, 1995).

Meanwhile, Patel et al. have reported a polarization-discriminating type all-optical switch which operates with the same mechanism as the switch described above (IEEE Photonics Technology Letters, Vol. 8, pp.1695–1697, 1996). Also this polarization-discriminating type all-optical switch (hereinafter referred to as second prior art) can be used as a wavelength converter similarly to the first prior art.

Further, Ueno et al. have proposed a wavelength converter (hereinafter referred to as third prior art) which has a structure simplified from that of the second prior art (IEEE Photonics Technology Letters, Vol. 10, pp.346–348, 1998, The extended abstracts of the 58th autumn meeting of the Japan Society of Applied Physics, No. 3, p.1138, October, 1997, 5a-ZB-6, and The extended abstracts of the 45th spring meeting of the Japan Society of Applied Physics and Related Societies, No. 3, p.1135, March, 1998, 29a-SZL-17).

The first to third prior arts described above are wavelength converters which convert the wavelength of a Return-to-Zero (RZ) optical signal and can output an optical pulse shorter than the carrier lifetime in a nonlinear semiconductor waveguide).

Duurhaas et al. have proposed a wavelength converter which operates with a mechanism different from that of the first to third prior arts described above (Journal of Lightwave Technology, Vol. 14, pp.942–954, 1996, hereinafter referred to as fourth prior art). The fourth prior art is a wavelength converter which converts the wavelength of a Non-Return-to-Zero (NRZ) optical signal.

However, since the wavelength converters of the first to fourth prior arts described above make use of variation in refractive index of a semiconductor to convert the wavelength, an output optical signal suffers from wavelength shifting or wavelength chirping. Particularly an output signal of the fourth prior art exhibits intense wavelength chirping.

An optical signal with which wavelength chirping occurs is deteriorated in transmission characteristic because the spectrum width thereof is broadened when compared with another optical signal with which no wavelength chirping occurs. For example, if the wavelength converter of the fourth prior art is used for WDM optical communication, then this gives rise to such a problem that the cross talk between communication channels increases and the transmission characteristic relies upon the sign of a group velocity dispersion of the transmission line.

In order to narrow the spectrum width of an optical signal, a wavelength filter should be used. This, however, gives rise to another problem that the S/N ratio is deteriorated or an optical pulse is distorted in shape.

On the other hand, with regard to the first to third prior arts, problems such as occurrence of significant wavelength chirping and deterioration in wavelength conversion efficiency are not apparent because investigation or research of wavelength shifting or wavelength chirping of an optical signal has not been performed till now.

SUMMARY OF THE INVENTION

It is an object of the present invention to provide a wavelength converter and a wavelength conversion method which converts a wavelength efficiently and reduces wavelength chirping of an output signal.

In order to attain the object described above, according to a wavelength converter and a wavelength conversion method of the present invention, the difference in arrival times of an input optical signal pulses at two nonlinear waveguides having a refractive index which varies in response to the input of an optical signal is set to correspond to 0.6~1.2 times the pulse width of the input optical signal pulse. As an alternative, the difference in arrival times of a first polarized light component and a second polarized light component at a nonlinear waveguide is set to correspond to 0.6~1.2 times the pulse width of an input optical signal pulse. As another alternative, the difference in arrival times of a first optical signal and a second optical signal, which are divided after passing through a nonlinear waveguide, at a coupling location is set to corresponds to 0.6~1.2 times the pulse width of an input optical signal pulse.

With the wavelength converter and the wavelength conversion method described above, since the momentary phase variation of the output signal pulse varies linearly with respect to time, wavelength chirping can be reduced.

The above and other objects, features, and advantages of the present invention will become apparent from the following description with references to the accompanying drawings which illustrate examples of the present invention.

BRIEF DESCRIPTION OF THE DRAWINGS

FIGS. 3A, 4A, 5A, 6A, 7A, 8A, 9A and 10A are graphs indicating results of simulations of the wavelength converter shown in FIG. 1 when $\Delta t_{d1}/\Delta T$ are varied and showing a phase variation of continuous light;

FIGS. 3B, 4B, 5B, 6B, 7B, 8B, 9B and 10B are graphs indicating results of simulations of the wavelength converter shown in FIG. 1 when $\Delta t_{d1}/\Delta T$ are varied and showing a phase variation of an output signal pulse;

FIGS. 3C, 4C, 5C, 6C, 7C, 8C, 9C and 10C are graphs indicating results of simulations of the wavelength converter shown in FIG. 1 when $\Delta t_{d1}/\Delta T$ are varied and showing an momentary wavelength variation of an output signal pulse;

DETAILED DESCRIPTION OF THE PREFERRED EMBODIMENTS (First Embodiment)

Figure 1:
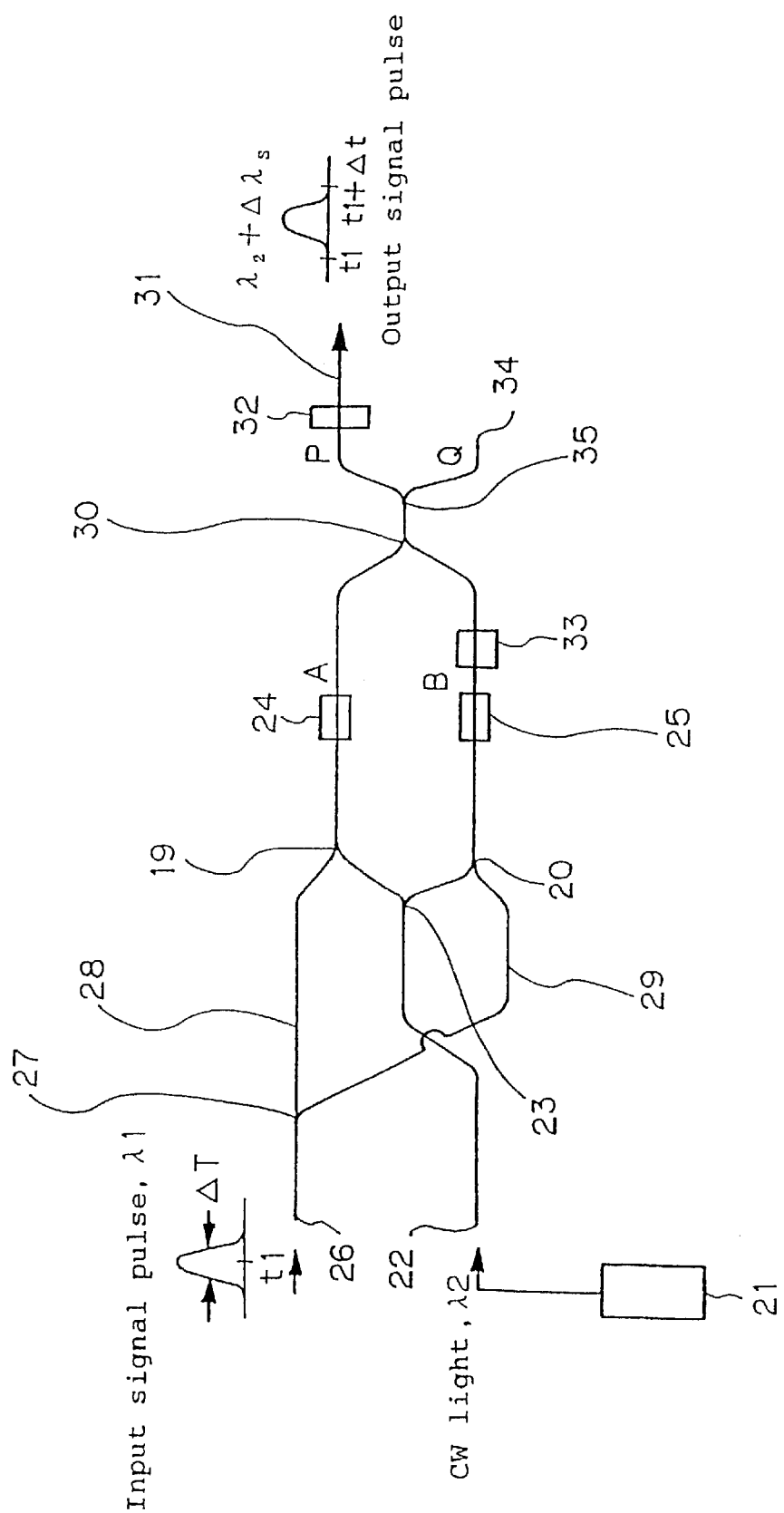
FIG. 1 is a block diagram showing a construction of a first embodiment of an optical signal wavelength converter of the present invention.

Referring to FIG. 1, the wavelength converter of the present embodiment includes first nonlinear waveguide 24 and second nonlinear waveguide 25 having refractive indices which vary in response to an optical signal inputted thereto, first signal input port 26 for inputting an optical signal pulse of wavelength $\lambda_1$ therethrough, second signal input port 22 for inputting continuous light (CW light) of wavelength $\lambda_2$ outputted from continuous light source 21 therethrough, first divider 27 for dividing the input signal pulse inputted through first signal input port 26, second divider 23 for dividing the continuous light inputted through second signal input port 22, first coupler 19 for coupling one of the optical signal pulses divided by first divider 27 and one of the continuous lights divided by second divider 23 and providing the coupled pulse to first nonlinear waveguide 24, second coupler 20 for coupling the other optical signal pulse divided by first divider 27 and the other continuous light divided by second divider 23 and providing the coupled pulse to second nonlinear waveguide 25, first optical path 28 for conducting one of the optical signal pulses divided by first divider 27 to the first coupler 19, second optical path 29 for conducting the other optical signal pulses divided by first divider 27 to the first coupler 19, phase adjuster 33 for adjusting the phase of an optical signal outputted from second nonlinear waveguide 25, third coupler 30 for coupling an optical signal outputted from first nonlinear waveguide 24 and an optical signal outputted from phase adjuster 33, third divider 35 for dividing the optical signal coupled by third coupler 30 again, wavelength filter 32 for removing an optical signal component of wavelength $\lambda_1$ from one of the optical signals divided by third divider 35, first output signal port 31 for outputting wavelength converted optical signals outputted from wavelength filter 32, and second output signal port 34 for outputting the other optical signals divided by third divider 35. It is to be noted that, while FIG. 1 shows a construction wherein phase adjuster 33 is disposed the stage after second nonlinear waveguide 25, phase adjuster 33 may alternatively be disposed the stage before second nonlinear waveguide 25 or in the stage before or after first nonlinear waveguide 24.

Figure 2:
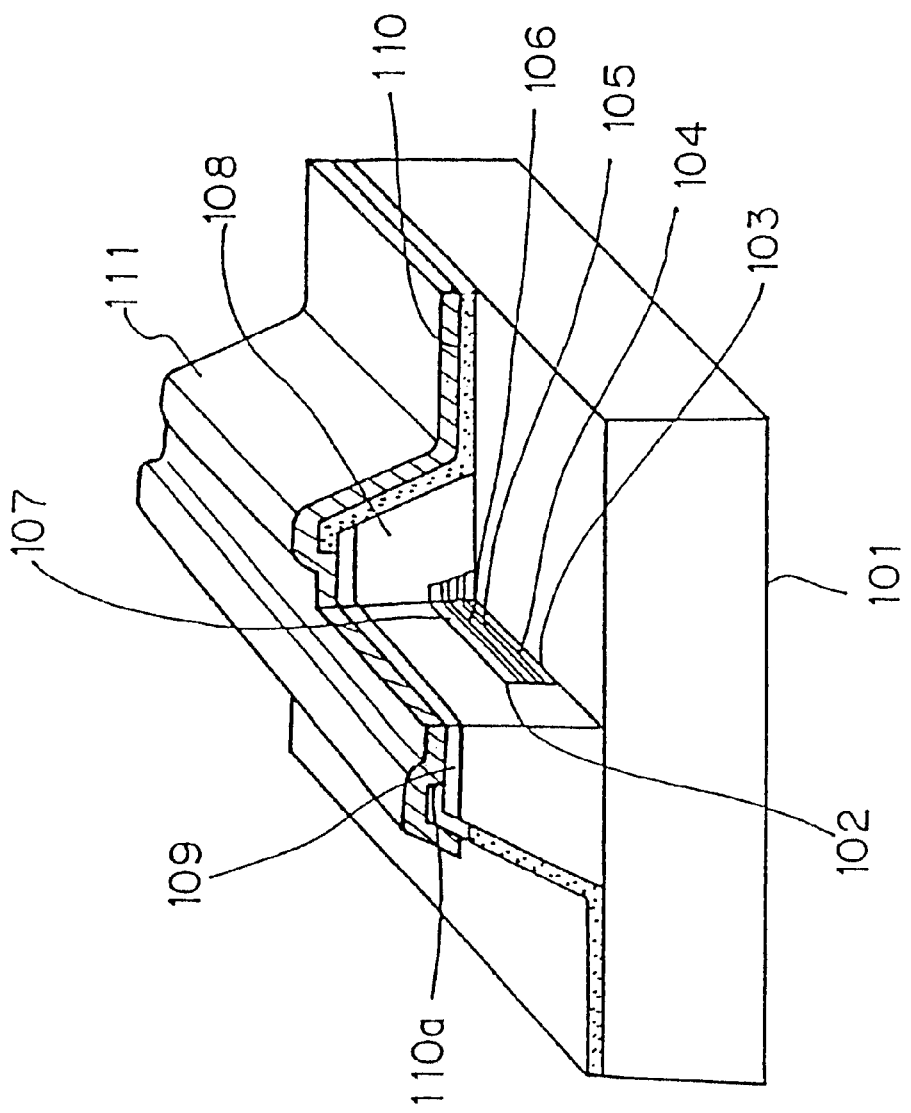
FIG. 2 is a perspective view showing a partial section of an example of a structure of a semiconductor amplifier used as a nonlinear waveguide shown in FIG. 1.

For first nonlinear waveguide 24 and second nonlinear waveguide 25, for example, a semiconductor optical amplifier having a bulk structure as shown in FIG. 2 or an absorption type semiconductor waveguide is used.

As shown in FIG. 2, a semiconductor optical amplifier has a structure wherein semiconductor stripe 102 is formed on n-type InP substrate 101. Semiconductor stripe 102 includes InP buffer layer 103 made of n-type InP crystal, first intermediate layer 104 made of undoped InGaAsP crystal, InGaAsP bulk active layer 105 serving as an optical waveguide, second intermediate layer 106 made of undoped InGaAsP crystal, and InP cover layer 107 made of p-type InP crystal. Semiconductor stripe 102 is covered with clad layer 108 made of p-type InP crystal, and cap layer 109 is formed on clad layer 108. Further, insulation film 110 is formed on cap layer 109, and electrode Ill is formed on insulation film 110. Cap layer 109 and electrode 111 are connected to each other through opening 110a perforated in insulation film 110.

An absorption type semiconductor waveguide has a structure similar to that of the semiconductor optical amplifier shown in FIG. 2, but is different from the semiconductor optical amplifier in that current is not injected while current is injected to the semiconductor optical amplifier through electrode 111. It is to be noted that FIG. 1 shows a construction wherein a semiconductor optical amplifier is used for first nonlinear waveguide 24 and second nonlinear waveguide 25.

In the wavelength converter having the construction described above, an optical signal pulse inputted through first signal input port 26 is divided at a ratio of 50:50 in optical power thereof by first divider 27, and one of the resulting optical signal pulses is inputted to first nonlinear waveguide 24 through first optical path 28 and first coupler 19. Meanwhile, the other optical signal pulse divided by first divider 27 is inputted to second nonlinear waveguide 25 through second optical path 29 and second coupler 20. Here, since second optical path 29 has an optical path length greater than that of first optical path 28, the other optical signal pulse divided by first divider 27 arrives at the nonlinear waveguide later than the one optical signal pulse divided by the first divider 27 (the arrival time difference is denoted by $\Delta t_{d1}$).

Meanwhile, continuous light inputted through second signal input port 22 is divided at a ratio of 50:50 in optical power by second divider 23, and one of the continuous lights is inputted to third coupler 30 through first nonlinear waveguide 24. The other continuous light divided by second divider 23 is inputted to third coupler 30 through second nonlinear waveguide 25 and phase adjuster 33. Third coupler 30 couples continuous light A outputted from first nonlinear waveguide 24 and continuous light B outputted from second nonlinear waveguide 25. The optical circuit from second divider 23 to third coupler 30 forms a Mach-Zehnder interferometer.

When first nonlinear waveguide 24 and second nonlinear waveguide 25 are semiconductor optical amplifiers, their refractive indices when an optical pulse is inputted thereto increase for a fixed time only. The time during which the refractive indices increase is equal to the pulse width of the inputted optical signal pulse, and the recovery time for the refractive indices to return their original value is equal to the carrier lifetime generated by injection of current.

Alternatively, when first nonlinear waveguide 24 and second nonlinear waveguide 25 are absorption type semiconductor waveguides their refractive indices decrease for a fixed time only when an optical signal pulse is inputted. The time decrease is equal to the pulse width of the inputted optical signal pulse, and recovery time is equal to the carrier lifetime generated by the optical signal pulse.

Figure 3A:
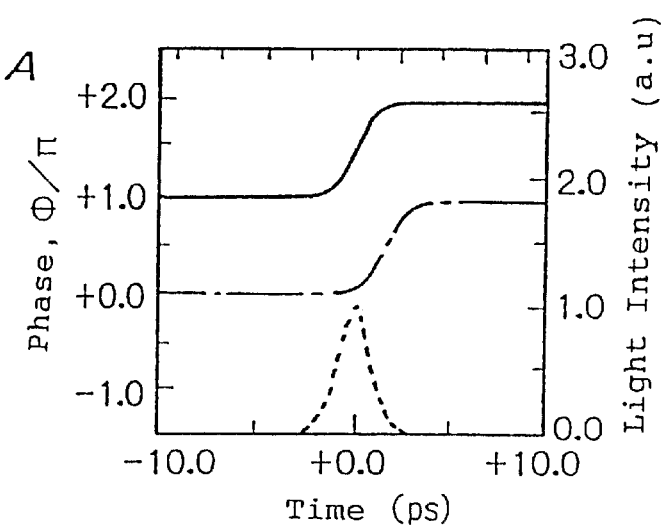

Accordingly, when semiconductor optical amplifiers are used as first nonlinear waveguide 24 and second nonlinear waveguide 25, the phases of continuous light which pass therethrough vary as in shown FIG. 3A in accordance with the variation of the refractive indices caused by the inputted optical signal pulse. It is to be noted that the solid line curve in FIG. 3A illustrates a way of phase variation of continuous light A which passes through first nonlinear waveguide 24 while the dot and long dash line of FIG. 3A illustrates a way of phase variation of the other continuous light B which passes through second nonlinear waveguide 25.

Since the time during which the refractive index of a nonlinear waveguide increases is practically equal to the pulse width (half value of pulse $\Delta T$) of the input signal pulse (pulse indicated by a broken line in FIG. 3A), the time during which the phases of continuous light A and continuous light B exhibit a variation is also practically equal to pulse width $\Delta T$. At this time, the phase of continuous light B changes later than continuous light A by $\Delta t_{d1}$ due to time difference $\Delta t_{d1}$ in the arrival time of the two input signal pulses at the nonlinear waveguides.

Continuous light A and continuous light B having changed phases once coupled once by third coupler 30 are then divided again at a ratio of 50:50 in optical power by third divider 35. It is to be noted that the construction from third coupler 30 to third divider 35 form a 2:2 optical coupler.

Optical signal P outputted as one of the divided signals from third divider 35 passes through wavelength filter 32 and is outputted through first output signal port 31 while the other divided optical signal Q outputted from third divider 35 is outputted through second output signal port 34.

At this time, the light amplitude of optical signal P is a composite value of continuous light A and continuous light B and is represented by $$E_P(t) = E_A(t) + E_B(t) \cdot e^{i\phi_b} \tag{1}$$

Meanwhile, the light amplitude of optical signal Q is represented by $$E_Q(t) = E_A(t) + E_B(t) \cdot e^{i(\phi_b + \pi)} \tag{2}$$

where $E_A(t)$ is the light amplitude of continuous light A, and $E_B(t)$ is the light amplitude of continuous light B.

If phase adjuster 33 is used to adjust the phase of continuous light B so that the phase difference between continuous light A and continuous light B is $\pi$, then components of continuous light A and components of continuous light B before phase variation occurs cancel each other and the components of continuous light A and the components of continuous light B after the phase variation occurs also cancel each other. Therefore, the light intensities of optical signal P and optical signal Q have finite values only within a period within which continuous light A and continuous light B exhibit a phase variation.

Accordingly, optical signal P has a pulse waveform with a pulse width determined by the pulse width $\Delta T$ of the input signal pulse and difference in arrival time $\Delta t_{d1}$ of the two input signal pulses at the nonlinear waveguides.

As seen from FIG. 3A, the phases of continuous light A and continuous light B vary practically linearly with the variation of the refractive indices of the nonlinear waveguides. In the present embodiment, the optical path lengths of first optical path 28 and second optical path 29 are set so that arrival time difference $\Delta t_{d1}$ of the input signal pulses at the nonlinear waveguides may satisfy $$\Delta t_{d1} = 0.6 \sim 1.2 \times \Delta T \tag{3}$$

with respect to pulse width $\Delta T$ of the input signal pulse.

Figure 3B:
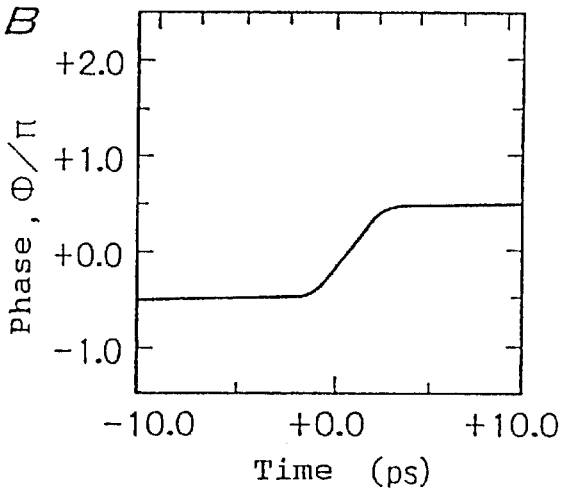
Figure 3C:
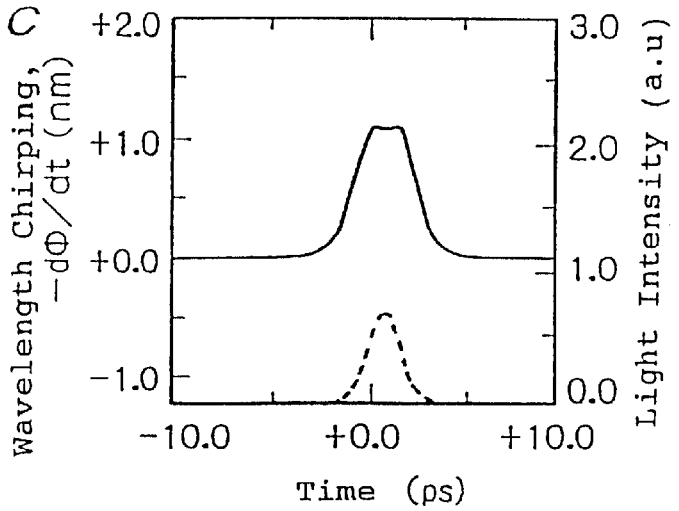

Particularly where $\Delta t_{d1} = 0.89 \times \Delta T$, since phase $\phi(t)$ of optical signal P after coupled varies practically linearly, as seen from FIG. 3B, the momentary wavelength variation of optical signal P caused by the phase variation of the nonlinear waveguide exhibits practically a fixed value as indicated by the solid line curve in FIG. 3C (in the example of FIG. 3C, approximately +1 nm).

In particular, the light intensity of optical signal P has a pulse-like waveform (broken line curve of FIG. 3C), and the momentary wavelength of optical signal P is $\lambda_2 + 1$ nm ($\lambda_2$ is the wavelength of continuous light source 21).

Meanwhile, if the transmission center wavelength of wavelength filter 32 is set to a wavelength a little longer than $\lambda_2$ of continuous light (to $\lambda_2 + \Delta\lambda_S$, in the example of FIG. 3C, $\Delta\lambda_S = +1$ nm) in advance, then an input signal pulse component of wavelength $\lambda_1$ is removed by wavelength filter 32 while only an optical signal component (P) of wavelength $\lambda_2 + \Delta\lambda_S$ passes through wavelength filter 32.

Accordingly, if the transmission center wavelength of wavelength filter 32 is set to a wavelength shifted by a fixed amount $(\Delta\lambda_S)$ from wavelength $\lambda_2$ Of the continuous light, then wavelength conversion can be performed efficiently. Further, if arrival time difference $\Delta t_{d1}$ at the nonlinear waveguides of input signal pulses and pulse width $\Delta T$ of input signal pulse are set to an appropriate relationship, then the momentary wavelength variation of optical signal P is practically fixed, and consequently, little wavelength chirping occurs in the output signal pulse.

When a semiconductor optical amplifier is used as the nonlinear waveguides, the amount of ASE (Amplified Spontaneous Emission) noise produced is greater than by an absorption type semiconductor waveguide. However, ASE noise can be reduced by employing wavelength filter 32 which has a narrow transmission band and has a central transmission wavelength set to $\lambda_2 + \Delta\lambda_S$.

When an absorption time semiconductor waveguide is used for first nonlinear waveguide 24 and second nonlinear waveguide 25, the wavelength of the output signal pulse is $\lambda_2 - \Delta\lambda_S$. In this instance, the transmission center wavelength of wavelength filter 32 is set to a wavelength $(\lambda_2 - \Delta\lambda_S)$ a little shorter then $\lambda_2$ in advance.

It is to be noted that the operating waveforms of the wavelength converter shown in FIGS. 3A to 3C are results of a simulation performed in accordance with the following basic expression representing a mechanism of variation of the refractive index of a nonlinear waveguide.

When a semiconductor optical amplifier is used as the nonlinear waveguides, variation amount $\Delta N_C(t)$ of the number of carriers in the semiconductor optical amplifier when an optical signal pulse of light amplitude $E_{in}(t)$ is inputted is represented by $$\Delta N_C(t) = (1 - G_0) \cdot \frac{1}{\hbar\omega} \cdot \int_{-\infty}^{t} |E_{in}(t')|^2 dt' \quad (4)$$

For simplified description, it is assumed here that the carrier lifetime of the nonlinear waveguide is sufficiently longer than input signal pulse width $\Delta T$.

At this time, refractive index variation $\Delta N_r(t)$ of the nonlinear waveguide increases in proportion to carrier number variation $\Delta N_C(t)$, and when the proportional constant is represented by $f_{BF}$, it is represented by $$\Delta N_C(t) = f_{BF} \cdot \Delta N_C(t) \quad (5)$$

Meanwhile, nonlinear phase variation $\Delta\phi(t)$ is given by $$\Delta\phi(t) = k_0 \cdot \Gamma \cdot \Delta N_r(t) \quad (6)$$

It is to be noted that $G_0$ in expression (4) above is the gain of the semiconductor optical amplifier, and $\pi\omega$ is the photon energy of the optical input signal, $k_0$ is the number of waves of the continuous light in the vacuum, and $\Gamma$ is the light confinement coefficient in an active layer (portion in which carriers are confined) of the nonlinear semiconductor waveguide.

In the meantime, when an absorption type semiconductor waveguide is used as the nonlinear waveguide, variation amount $\Delta N_C(t)$ of the number of carriers in the absorption type semiconductor optical amplifier is represented by $$\Delta N_C(t) = \frac{1}{\hbar\omega} \cdot \int_{-\infty}^{t} |E_{in}(t')|^2 dt' \quad (7)$$

It is to be noted that the pulse shape of the input signal pulse is the soliton shape represented by $$E_{in}(t) = E_{in} \cdot \mathrm{sech}\left(\frac{t}{T_0}\right) \quad (8)$$

At this time, pulse width $\Delta T$ of the input signal pulse satisfies the relationship of $\Delta T = 1.76 \times T_0$.

It is to be noted that the momentary wavelength variation illustrated in FIG. 3C was calculated in accordance with a general relational expression:

$$\lambda(t) = \lambda_0 - \frac{2\pi}{\lambda_0^2} \cdot \frac{d\phi(t)}{dt} \quad (9)$$

where $\lambda_0$ is the wavelength before transient phase variation occurs, and c is the velocity of light.

Figure 4A:
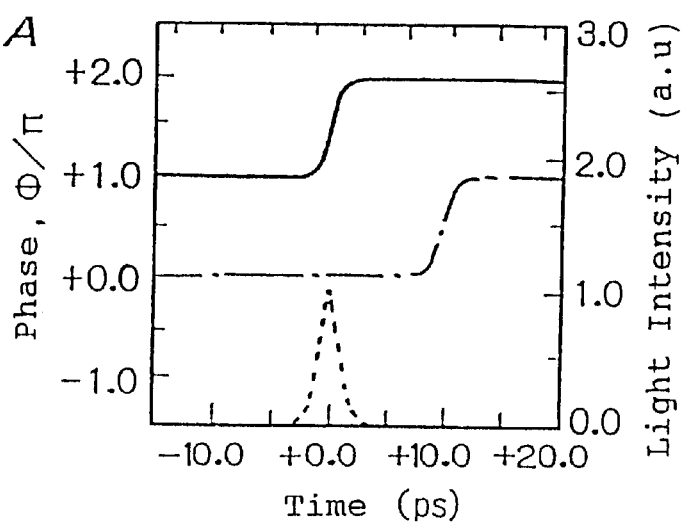
Figure 4B:
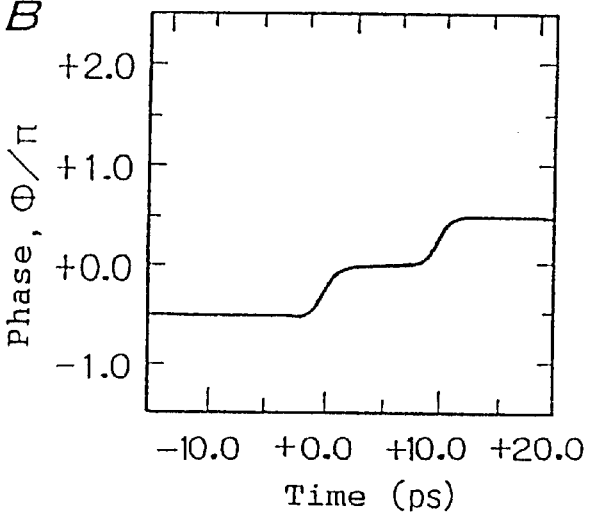

When the relationship between $\Delta t_{d1}$ and $\Delta T$ is given by $$\Delta t_{d1} = 5 \times \Delta T \quad (10)$$

the phase variation of continuous light becomes as indicated by the solid line curve in FIG. 4A (the broken line curve in FIG. 4A shows the input signal pulse). Further, the phase variation of optical signal P after it is coupled is as shown in FIG. 4B. Further, the momentary wavelength variation of optical signal P is as indicated by a solid line curve in FIG. 4C while the light intensity of optical signal P is as indicated by a broken line curve.

Figure 4C:
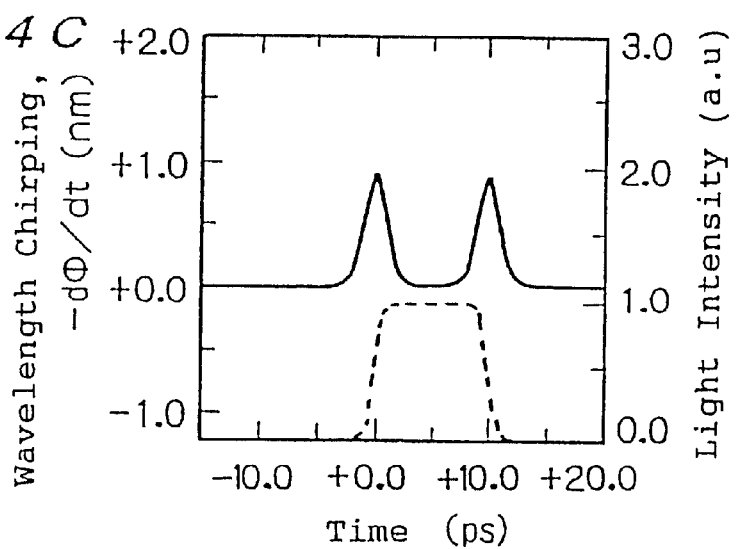
Figure 5A:
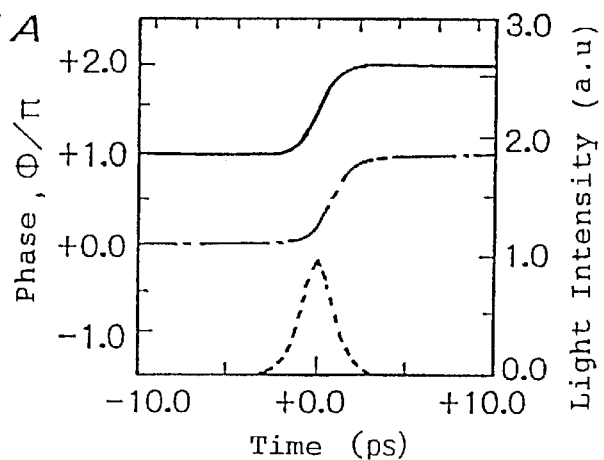
Figure 5B:
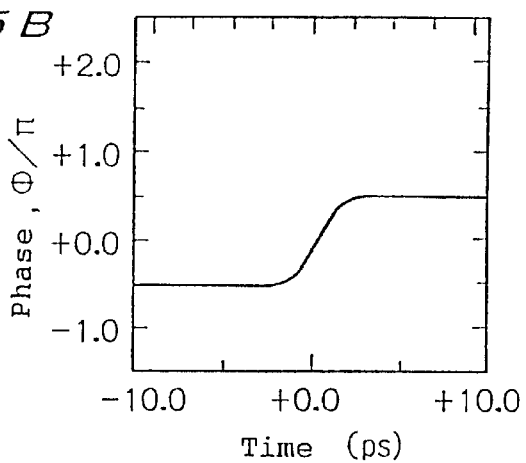
Figure 5C:
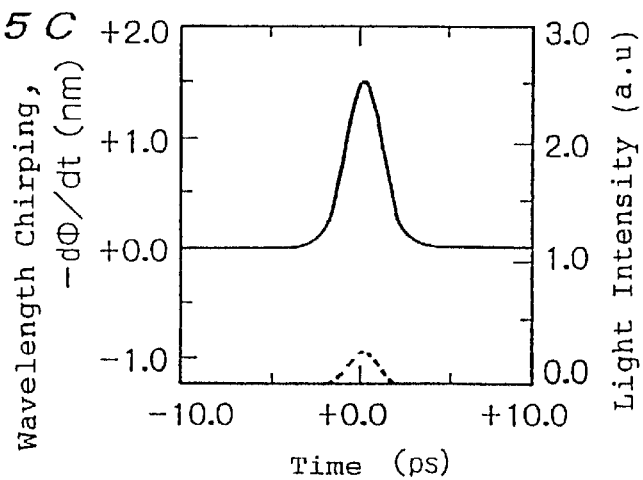
Figure 7A:
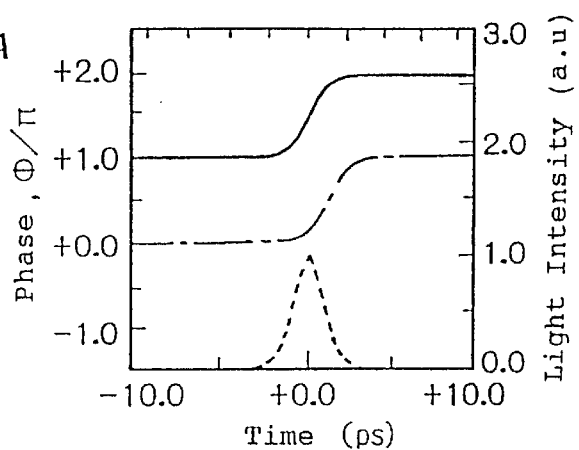
Figure 7B:
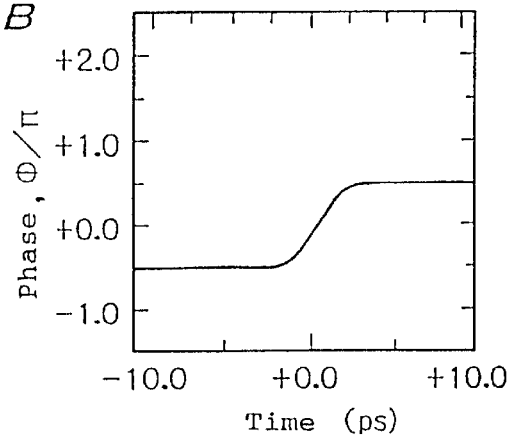
Figure 7C:
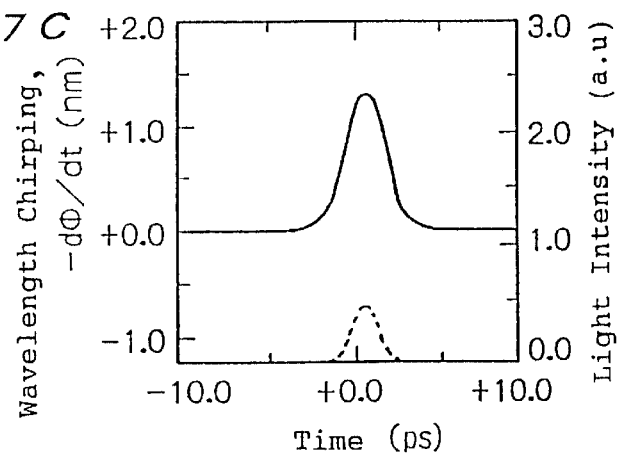
Figure 8B:
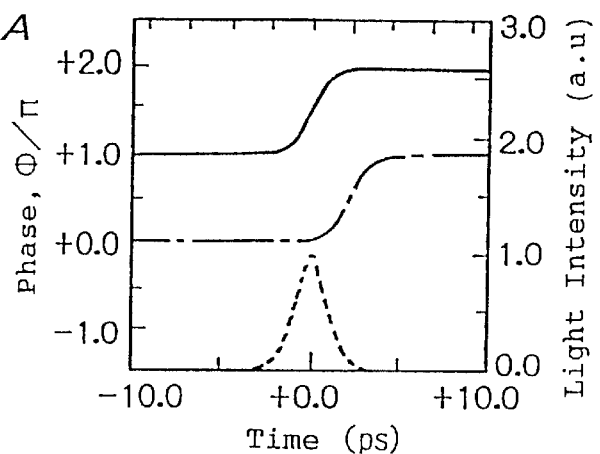
Figure 8B:
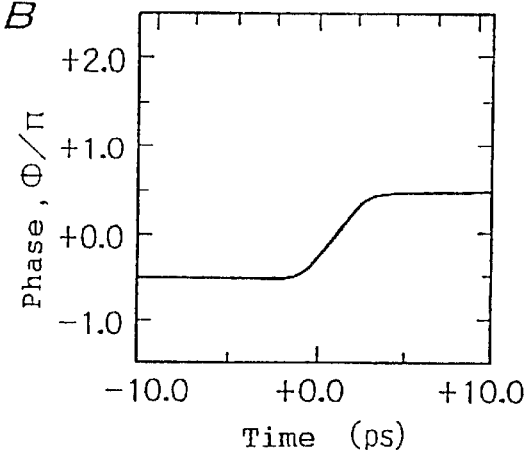
Figure 8C:
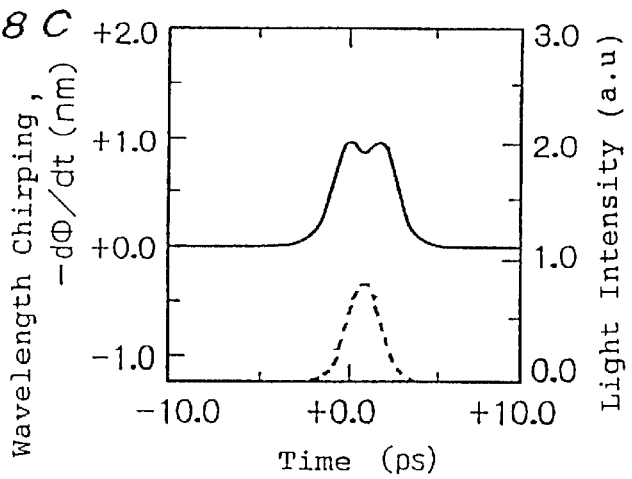
Figure 9A:
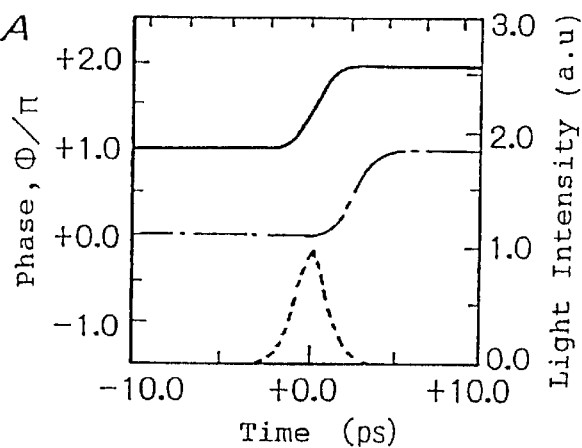
Figure 9B:
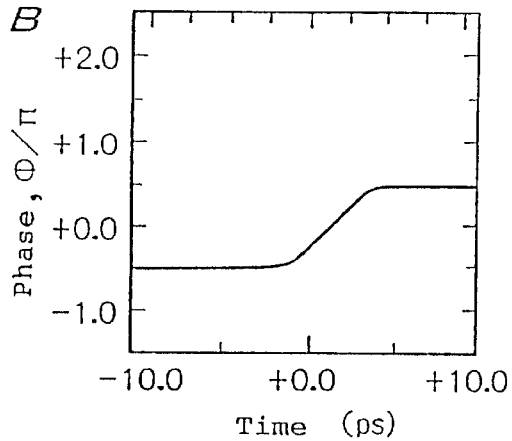
Figure 9C:
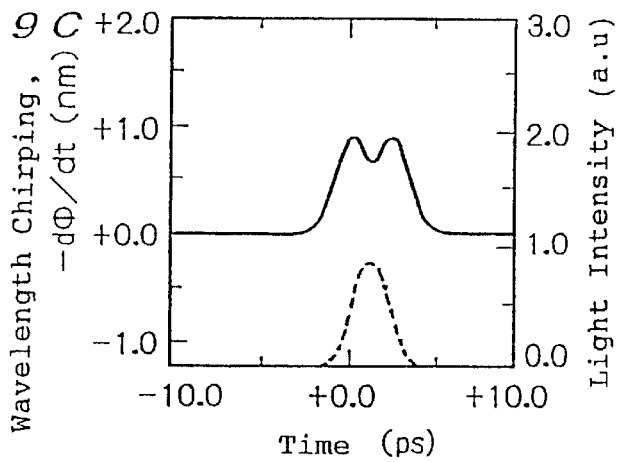
Figure 10A:
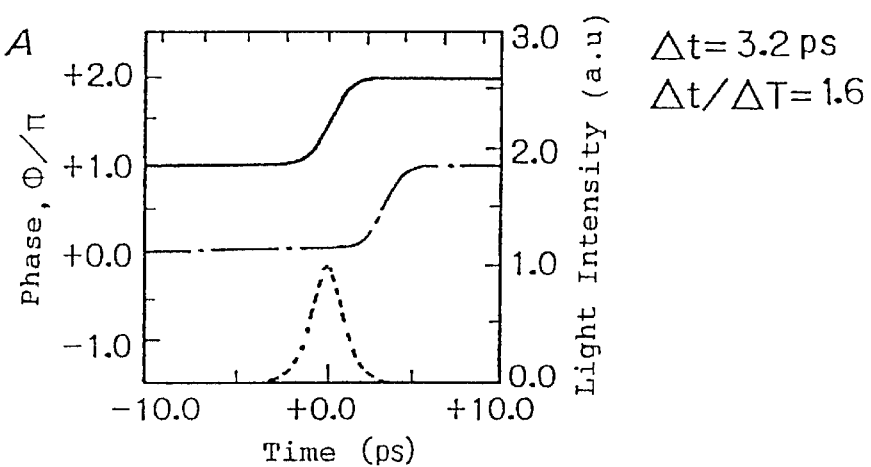
Figure 10B:
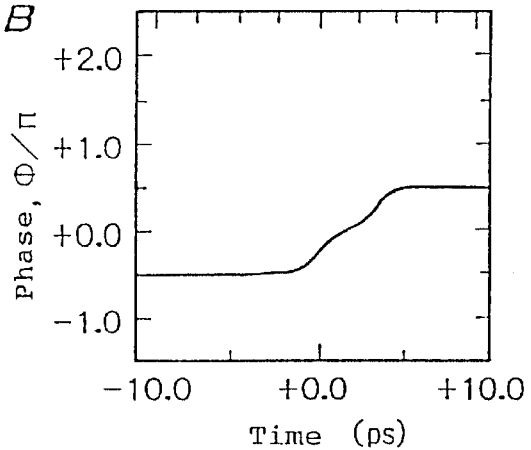
Figure 10C:
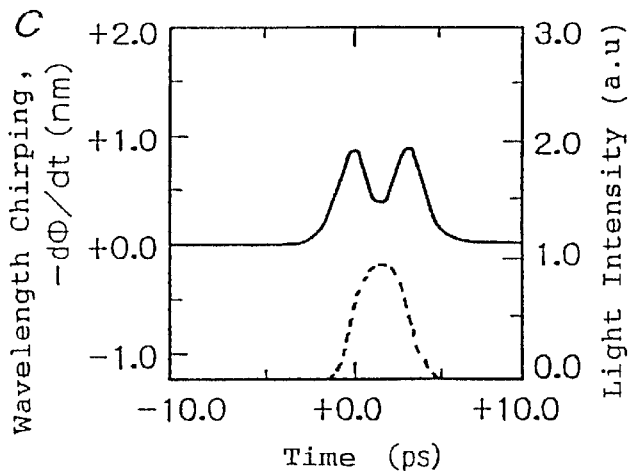

In particular, when arrival time difference $\Delta t_{d1}$ of the input signal pulses at the nonlinear waveguides is set long (here, $\Delta t_{d1} = 5 \times \Delta T$), since the phase variation of optical signal P does not exhibit a linear variation as seen from FIG. 4B, the momentary waveform is not fixed, and high wavelength chirpings of the same sign are generated at the rising edge and the falling edge of the light intensity of optical signal P as seen from FIG. 4C.

In the following, the reason why the relationship between pulse width $\Delta T$ of the inputted signal pulse and arrival time difference $\Delta t_{d1}$ given by expression (3) above is $\Delta t_{d1} = 0.6 \sim 1.2 \times \Delta T$ is described.

Generally, in order to transmit large capacity optical signals higher than 2.5 Gbps over a long distance, it is necessary to control broadening of an optical pulse caused by waveform dispersion in an optical transmission line (optical fiber).

To this end, a technique for controlling the group velocity dispersion of the optical fiber used as a transmission line and a technique for compensating for dispersion in a transmission line for fixed distances (so-called dispersion management) have been proposed (The technical digest of the Second Workshop of Research Group for Optical Soliton Communications, PP.1–38, Apr. 8, 1997).

In optical communication in which optical pulses are used, preferably the pulse width of an output signal pulse is within ±25% of the pulse width of an input signal pulse, and preferably, the wavelength chirping amount of the output signal pulse does not exceed 25% of the spectrum width of the input signal pulse which has no wavelength chirping.

Here, the state of the waveform of the output signal pulse and the wavelength chirping when ratio $\Delta t_{d1}/\Delta T$ was set to $\Delta t_{d1}/\Delta T = 0.40, 0.50, 0.60, 1.0, 1.2, 1.6$ are as shown in FIGS. 5A to 5C and FIGS. 10A to 10C. The figures illustrate the results of simulations conducted under conditions in which the signal repetition frequency was 100 Gbps (signal interval=10 ps), the signal input pulse was a sech type optical pulse which had no wavelength chirping, the pulse width (full width half value) was 2.0 ps, the center wavelength of the input signal pulse was 1.5 $\mu$m, and the spectrum width (width half value) was 1.26 nm.

Further, solid line curves in FIGS. 5A, 6A, 7A, 8A, 9A and 10A illustrate ways of phase variation of one of the continuous lights which passes through first nonlinear waveguide 24; the dot and long dash lines illustrate ways of phase variation of the other continuous light which passes through second nonlinear waveguide 25; and broken lines illustrate light intensities of the input signal pulse. Meanwhile, FIGS. 5B, 6B, 7B, 8B, 9B and 10B illustrate ways of phase variation of optical signal P, and solid lines in FIGS. 5C, 6C, 7C, 8C, 9C and 10C illustrate momentary wavelength variations of optical signal P and broken lines illustrate light intensities of optical signal P.

Figures 11A, 11B:
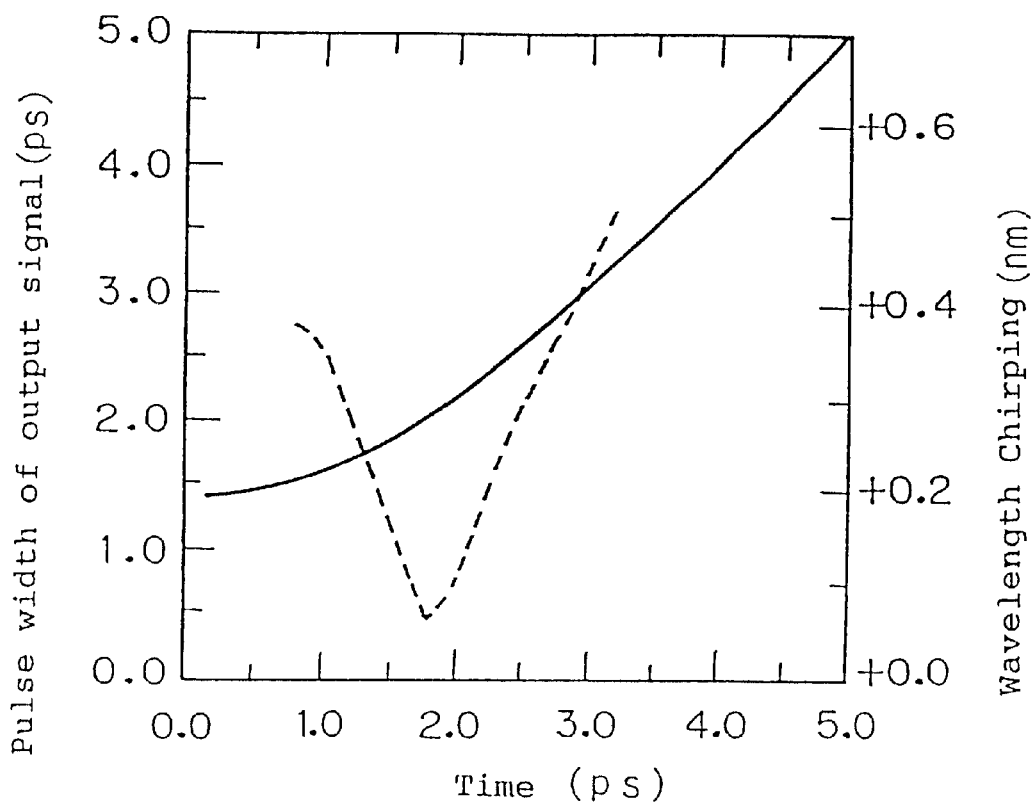
FIG. 11A is a graph collectively showing output pulse widths shown in FIGS. 3A to 3C through 10A to 10C and a result of simulation of wavelength chirping.
FIG. 11B is a table collectively showing the output pulse widths shown in FIGS. 3A to 3C through 10A to 10C and the result of simulation of wavelength chirping.
Figure 12:
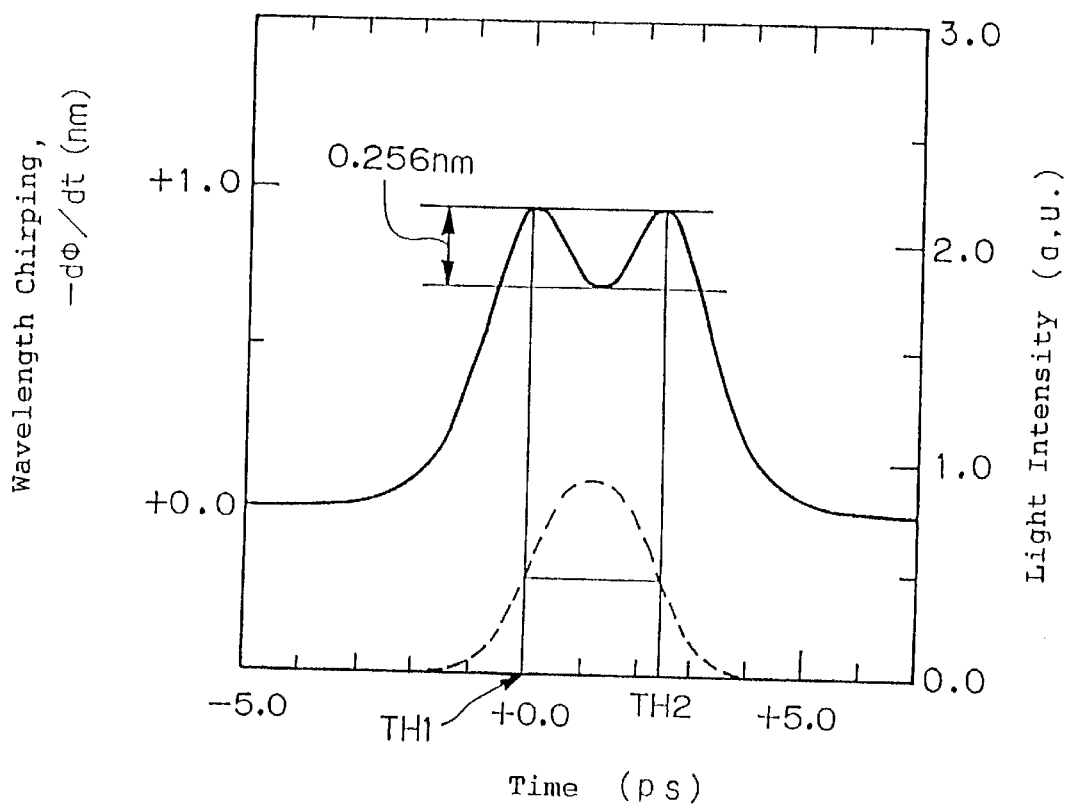
FIG. 12 is a graph illustrating a definition of wavelength chirping.

It is to be noted that FIG. 11A is a graph collectively showing the results of the simulation of the output pulse widths (solid lines) and wavelength chirping amounts (broken lines) shown in FIGS. 5A to 5C through 50A to 10C, and FIG. 11B is a table of the results of the simulation (the input signal pulse width is 2 ps,). Meanwhile, FIG. 12 is a view showing a definition of wavelength chirping, and in FIG. 12, a broken line curve indicates an intensity variation of the output signal pulse and a solid line curve indicates momentary wavelength variation. Referring to FIG. 12, where the times at which the momentary intensity of the output signal pulse has a value equal to ½ the peak intensity are represented by TH1 and TH2, the difference between a maximum value and a minimum value of the momentary wavelength between TH1 and TH2 is defined as wavelength chirping of the output pulse.

As seen from FIGS. 5A to 5C and 11A and 11B, where $\Delta t_{d1}/\Delta T=0.4$, the pulse width of the output signal pulse is 75.25% of the pulse width of the input signal pulse, and the wavelength chirping of the output signal pulse is 0.384 nm. Further, the ratio between the wavelength chirping of the output signal pulse and the spectrum width of the input signal pulse is 30.5%.

As seen from FIGS. 6A to 6C and 11A and 11B, where $\Delta t_{d1}/\Delta T=0.5$, the pulse width of the output signal pulse is 78.9% of the pulse width of the input signal pulse, and the wavelength chirping of the output signal pulse is 0.360 nm. Further, the ratio between the wavelength chirping of the output signal pulse and the spectrum width of the input signal pulse is first optical path 28.6%.

As seen from FIGS. 7A to 7C and 11A and 11B, where $\Delta t_{d1}/\Delta T=0.6$, the pulse width of the output signal pulse is 83.5% of the pulse width of the input signal pulse, and the wavelength chirping of the output signal pulse is 0.284 nm. Further, the ratio between the wavelength chirping of the output signal pulse and the spectrum width of the input signal pulse is 22.5%.

Further, as seen from FIGS. 3A to 3C, where $\Delta t_{d1}/\Delta T=0.89$, the pulse width of the output signal pulse coincides with the pulse width of the input signal, and the wavelength chirping of the output signal pulse is 0.060 nm and almost disappears (refer to FIGS. 11A and 11B).

As seen from FIGS. 8A to 8C and 11A and 11B, where $\Delta t_{d1}/\Delta T=1.0$, the pulse width of the output signal pulse is 108.5% of the pulse width of the input signal pulse, and the wavelength chirping of the output signal pulse is 0.100 nm. Further, the ratio between the wavelength chirping of the output signal pulse and the spectrum width of the input signal pulse is 7.9%.

As seen from FIGS. 9A to 9C and 11A and 11B, where $\Delta t_{d1}/\Delta T=1.2$, the pulse width of the output signal pulse is 124.5% of the pulse width of the input signal pulse, and the wavelength chirping of the output signal pulse is 0.256 nm. Further, the ratio between the wavelength chirping of the output signal pulse and the spectrum width of the input signal pulse is 20.3%.

Further, as seen FIGS. 10A to 10C and 11A and 11B, where $\Delta t_{d1}/\Delta T=1.6$, the pulse width of the output signal pulse is 161.0% of the pulse width of the input signal pulse, and the wavelength chirping of the output signal pulse is 0.50 nm. Further, the ratio between the wavelength chirping of the output signal pulse and the spectrum width of the input signal pulse is 39.7%.

As described above, it can be recognized that, within the range of $\Delta t_{d1}/\Delta T=0.6\sim1.2$, the pulse width of the output signal pulse remains within ±25% of the pulse width of the input signal pulse and the wavelength chirping amount of the output signal pulse remains within 25% of the spectrum width of the input signal pulse.

Accordingly, the wavelength chirping of the output signal pulse can be reduced by setting the arrival time difference of the input signal pulses at the nonlinear waveguides so that it is 0.6~1.2 times the pulse width of the input signal.

Figure 13A:
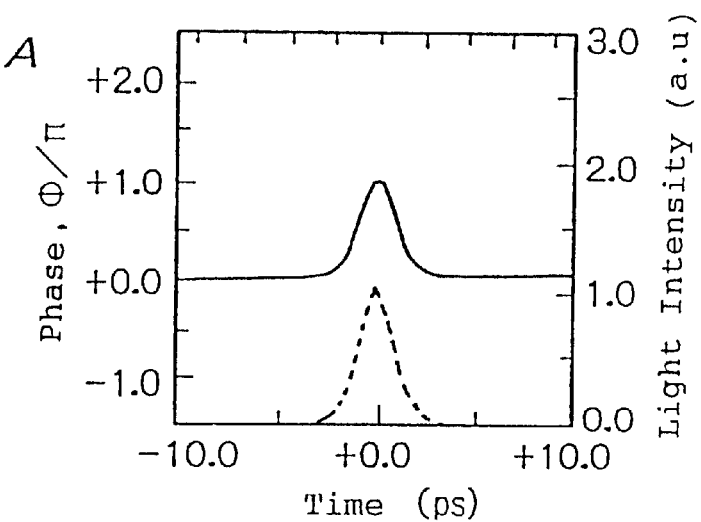
FIG. 13A is a graph indicating results of a simulation of a wavelength converter of the fourth prior art and showing a phase variation of continuous light.
Figure 13B:
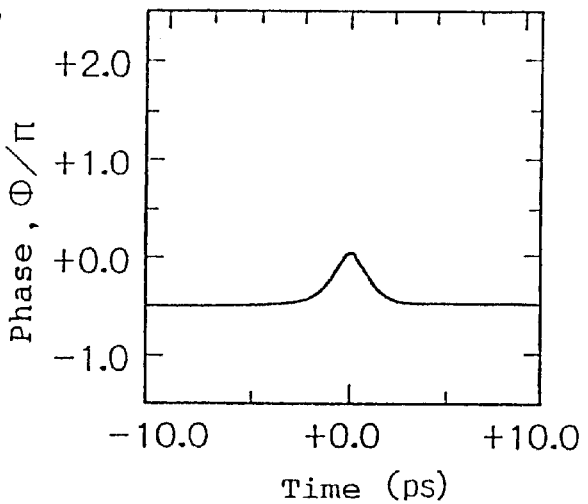
FIG. 13B is a graph indicating results of a simulation of the wavelength converter of the fourth prior art and showing a phase variation of an output signal pulse.
Figure 13C:
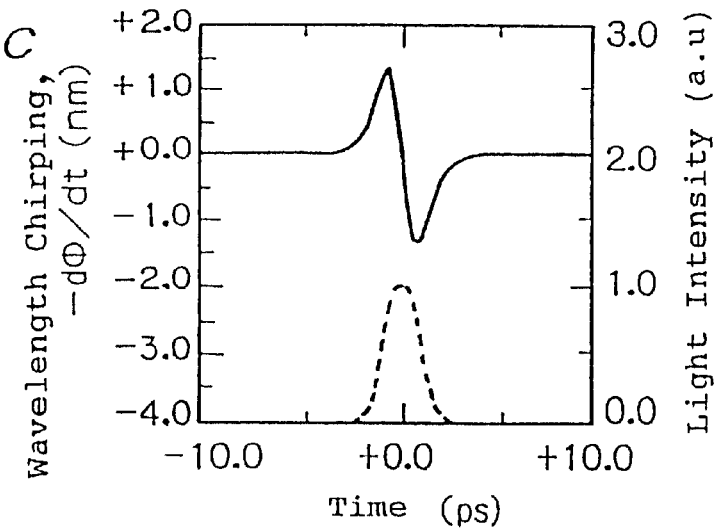
FIG. 13C is a graph indicating result of a simulation of the wavelength converter of the fourth prior art and showing an momentary wavelength variation of an output signal pulse.

For reference, ways of operation of the wavelength converter of the fourth prior art is illustrated in FIGS. 13A to 13C. In particular, a solid line curve in FIG. 13A indicates a transient phase variation of continuous light and a broken line indicates the input signal pulse. FIG. 13B illustrates a phase variation of the signal output pulse, and a solid line curve in FIG. 13C illustrates an momentary waveform variation of the output signal pulse and a broken lines indicates an light intensity of the output signal pulse.

As seen from FIG. 13C, high wavelength chirpings of the different sign are generated at the rising edge and the falling edge of the output signal pulse in the fourth prior art.

In the following, a example of the present embodiment is described.

In the present working example, a nonlinear waveguide for which a semiconductor optical amplifier including an InGa/As/InP double hetero semiconductor layer (IEEE Photonics Technology letters, Vol. 10, pp.346–348, 1998) is used is taken as an example of the nonlinear waveguide shown in FIG. 1 in order to describe advantages of the present invention. The gain peak wavelength of the semiconductor optical amplifier used was 1,550 nm and the gain ($G_0$) was 20 dB. Further, the input signal pulse width was 2 ps, the center wavelength was 1,550 nm, and the spectrum width was 1.2 nm, and, of the continuous light, the wavelength was 1,559 nm and the spectrum width was 10 MHz or less. Further, the optical path and the optical delay path were each formed from optical fibers and an optical fiber coupler, and the center wavelength of the wavelength filter was 1,560 nm and the wavelength band was 2 nm.

Based on the construction described above, a wavelength converter was achieved successfully which converts an input signal pulse whose center wavelength is 1,550 nm and whose pulse width is 2 ps into an output signal pulse whose wavelength is 1,560 nm and whose pulse width is 2 ps.

Further, with the wavelength converter of the construction described above, the conversion efficiency from input signal pulse into an output signal pulse was 150%, and the ratio of the peak intensity of the output signal pulse to the intensity of continuous light was 300%.

(Second Embodiment)

In the following, a second embodiment of the present invention is described with reference to the drawings.

Figure 14:
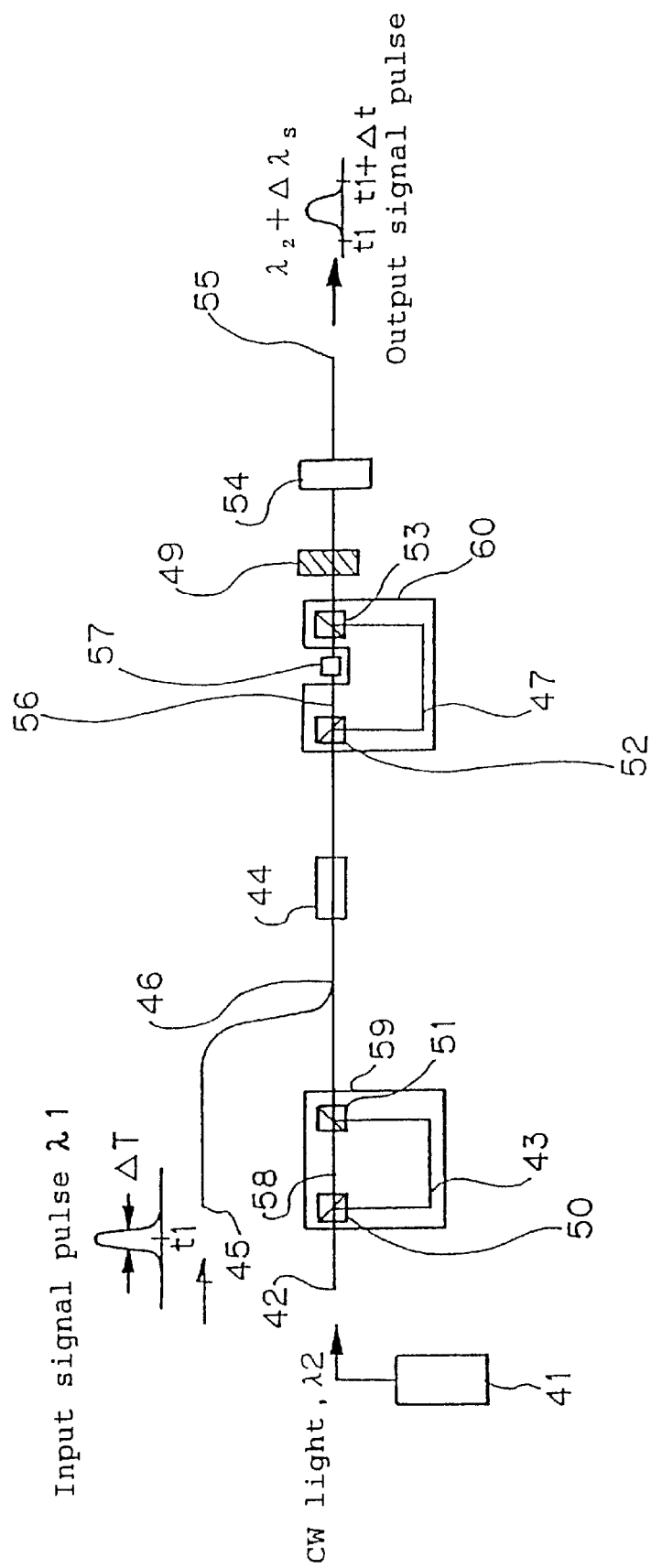
FIG. 14 is a block diagram showing a construction of a second embodiment of the wavelength converter of the present invention.

Referring to FIG. 14, the wavelength converter of the present embodiment includes nonlinear waveguide 44 having a refractive index which varies in response to an optical signal pulse inputted thereto, first signal input port 45 for inputting the optical signal pulse of wavelength $\lambda_1$ therethrough, second signal input port 42 for inputting continuous light (CW light) of wavelength $\lambda_2$ outputted from continuous light source 41 therethrough, first optical circuit 59 for dividing the continuous light (CW light) inputted through second signal input port 42 into a p-polarized light component and an s-polarized light component and conducting the p-polarized light component and the s-polarized light component to nonlinear waveguide 44 with a time delay corresponding to 0.6~1.2 times the pulse width of the input optical signal pulse, second optical circuit 60 for dividing an optical signal outputted from nonlinear waveguide 44 into a p-polarized light component and an s-polarized light component and coupling the p-polarized light component and the s-polarized light component while making arrival times of them coincide with each other, phase adjuster 57 for adjusting the phase of the optical signal of the s-polarized light component outputted from second polarization divider 52, polarization filter 49 for outputting the p-polarized light component and the s-polarized light component of the optical signal outputted from second polarization coupler 53 at a ratio of 50:50 in optical power, wavelength filter 54 for removing the optical signal pulse of wavelength $\lambda_1$, and output signal port 55 for outputting the wavelength converted optical signal therethrough.

First optical circuit 59 includes first polarization divider 50 for dividing the continuous light inputted through second signal input port 42 into a p-polarized light component and an s-polarized light component, and first polarization coupler 51 for coupling the p-polarized light component having passed through first optical path 58 and the s-polarized light component having passed through first optical delay path 43.

Second optical circuit 60 includes second polarization divider 52 for dividing an optical signal outputted from nonlinear waveguide 44 into a p-polarized light component and an s-polarized light component, and second polarization coupler 53 for coupling the s-polarized light component having passed through second optical path 56 and the p-polarized light component having passed through second optical delay path 47. Wavelength filter 54 passes only an optical signal pulse (wavelength $\lambda_2+\Delta\lambda_S$) after wavelength converted and removes the input signal pulse component of wavelength $\lambda_1$ similarly as in the first embodiment. FIG. 14 illustrates a way of wavelength conversion in which a semiconductor optical amplifier is used as nonlinear waveguide 44.

In the wavelength converter having the construction described above, an input signal pulse inputted through first signal input port 45 passes through coupler 46 and comes to nonlinear waveguide 44, and varies the refractive index of nonlinear waveguide 44.

Meanwhile, continuous light inputted through second signal input port 42 is divided into a p-polarized light component and an s-polarized light component by first polarization divider 50 (for example, a polarizing beam splitter).

The p-polarized light component divided by first polarization divider 50 successively passes first optical path 58, first polarization coupler 51 (for example, a polarizing beam splitter), coupler 46, nonlinear waveguide 44, second polarization divider 52, phase adjuster 57 and second polarization coupler 53 and comes to polarization filter 49.

In the meantime, the s-polarized light component divided by first polarization divider 50 successively passes through first optical delay path 43, first polarization coupler 51, coupler 46, nonlinear waveguide 44, second polarization divider 52, second optical path 56, phase adjuster 57 and second polarization coupler 53 and comes to polarization filter 49.

First optical delay path 43 has an optical path length greater by $\Delta Ld$ than that of first optical path 58, and second optical delay path 47 has an optical path length greater by $\Delta Ld$ than that of second optical path 56 and phase adjuster 57. Accordingly, the p-polarized light component and the s-polarized light component of the optical signal arrive simultaneously at polarization filter 49.

However, the time at which the s-polarized light coupled by first polarization coupler 51 passes through nonlinear waveguide 44 later by $$\Delta t = \frac{\Delta L_d}{V_g} \tag{11}$$

the time at which the p-polarized light component passes through nonlinear waveguide 44. where $V_g$ is the velocity of propagation of the optical signal which propagates along first optical path 58.

Consequently, the phase of the p-polarized light component of the optical signal arriving at polarization filter 49 has a variation as indicated by a solid line curve in FIG. 3A while the phase of the s-polarized light component has another variation as indicated by an dot and long dash line in FIG. 3A.

It is to be noted that the orientation of the optical axis of polarization filter 49 is adjusted in advance so that the p-polarized light component and the s-polarized light com-ponent may be coupled at 50:50 while phase adjuster 57 is adjusted so that the phase difference between the p-polarized light component and the s-polarized light component may be $\pi$.

Accordingly, the coupled light of the p-polarized light component and the s-polarized light component outputted from polarization filter 49 has a pulse-like waveform.

Further, the optical path lengths of first optical path 58 and first optical delay path 43 are set so that arrival time difference $\Delta t_{d2}$ between the p-polarized light component and the s-polarized light component of the continuous light arriving at nonlinear waveguide 44 may be $\Delta t_{d2}$=0.6~1.2× $\Delta T$ with respect to pulse width $\Delta T$ of the input signal pulse.

Since the wavelength converter has the construction described above, it can efficiently convert an input signal pulse of wavelength $\lambda_1$ into an output signal pulse of wavelength $\lambda_2+\Delta\lambda_S$ similarly as in the first embodiment. Further, since the phase variation amount, the shift amount of the center wavelength and the wavelength chirping amount at this time also have similar values to those in the first embodiment, wavelength chirping of the output signal pulse can be reduced. Furthermore, also ASE noise can be reduced by using a wavelength filter having a narrow transmission band.

It is to be noted that, where an absorption type semiconductor waveguide is used for nonlinear waveguide 44, the wavelength of the output signal pulse is $\lambda_2-\Delta\lambda_S$. In this instance, the transmission center wavelength of wavelength filter 54 is set to a wavelength ($\lambda_2-\Delta\lambda_S$) a little shorter than $\lambda_2$ in advance.

(Third Embodiment)

In the following, a third embodiment of the present invention is described with reference to the drawings.

Figure 15:
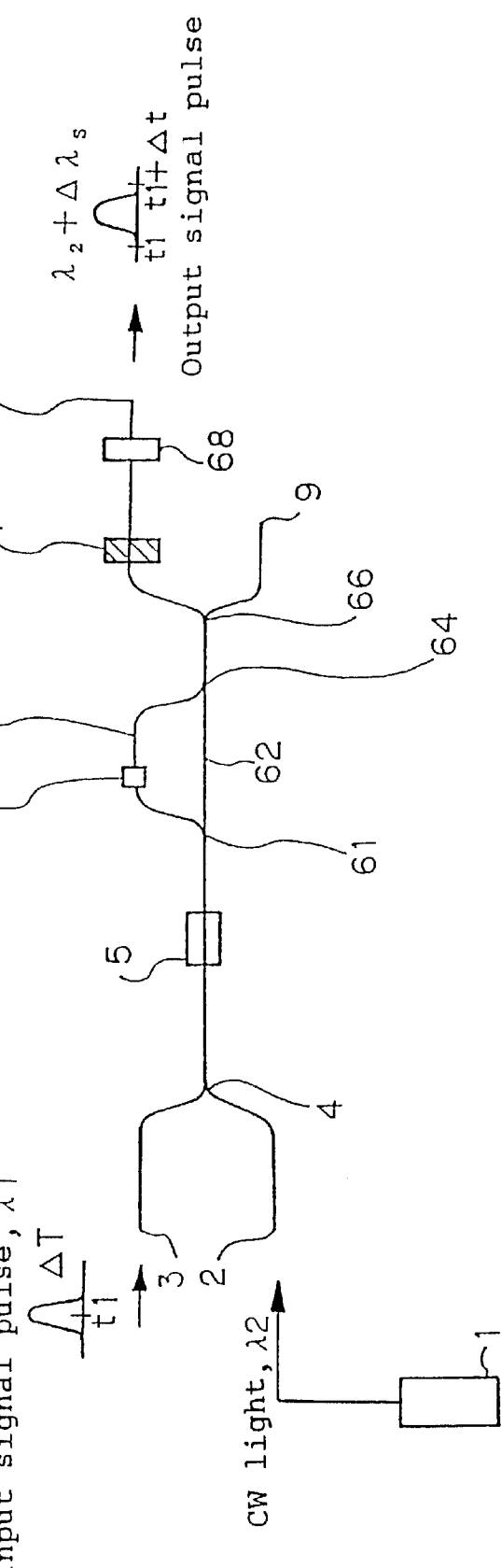
FIG. 15 is a block diagram showing a construction of a third embodiment of the wavelength converter of the present invention.

Referring to FIG. 15, the wavelength converter of the present embodiment includes nonlinear waveguide 5 having a refractive index which varies in response to an optical signal pulse inputted thereto, first signal input port 3 for inputting an optical signal pulse (input signal pulse) of wavelength $\lambda_1$ therethrough, second signal input port 2 for inputting continuous light (CW light) of wavelength $\lambda_2$ outputted from continuous light source 1 therethrough, first coupler 4 for coupling the input signal pulse inputted through first signal input port 3 and the continuous light inputted through second signal input port 2, first divider 61 for dividing an optical signal outputted from nonlinear waveguide 5, second coupler 64 for coupling one of the optical signals outputted from first divider 61 which has passed optical path 62 and the other optical signal which has passed optical delay path 63, phase adjuster 67 for adjusting the phase of the other optical signal divided by first divider 61, second divider 66 for dividing an optical signal outputted from second coupler 64, polarizer 7 for passing only a predetermined polarized light component therethrough, wavelength filter 68 for removing the optical signal pulse of wavelength $\lambda_1$, and first signal output port 69 and second signal output port 9 for outputting wavelength converted optical signals therethrough. It is to be noted that wavelength filter 68 passes only the optical signal pulse (wavelength $\lambda_2+\Delta\lambda_S$) after wavelength converted and removes the input signal pulse component of wavelength $\lambda_1$ similarly as in the first embodiment. FIG. 15 illustrates the construction of wavelength converter where a semiconductor optical amplifier is used for nonlinear waveguide 5.

In the wavelength converter having the construction described above, a signal pulse inputted through first signal input port 3 passes through first coupler 4 and arrives at nonlinear waveguide 5, and varies the refractive index of nonlinear waveguide 5.

Meanwhile, continuous light (CW light) inputted through second signal input port 2 successively passes through first coupler 4 and nonlinear waveguide 5 and is divided at a ratio of 50:50 in optical power thereof by first divider 61.

One of the optical signals (a first optical signal) divided by first divider 61 passes optical path 62 and arrives at second coupler 64, while the other optical signal (second optical signal) divided by first divider 61 passes phase adjuster 67 and optical delay path 63 and arrives at second coupler 64. Second coupler 64 couples the first optical signal and the second optical signal.

It is to be noted that, since the optical circuits from first divider 61 to second coupler 64 individually maintain the polarization of the optical signals inputted thereto, the first optical signal and the second optical signal at second coupler 64 have the same polarization state.

Further, since the optical path length of phase adjuster 67 and optical delay path 63 is longer than the optical path length of optical path 62, the second optical signal arrives at second coupler 64 later by $\Delta t_{d3}$ than the first optical signal. Accordingly, a phase variation of the second optical signal by second coupler 64 occurs later by $\Delta t_{d3}$ than a phase variation of the first optical signal.

In the present embodiment, the phase of the second signal is adjusted by phase adjuster 67 so that the phase difference between the first optical signal and the second optical signal may be $\pi$. Further, the optical path length of phase adjuster 67 and optical delay path 63 and the optical path length of optical path 62 are adjusted so that arrival time difference $\Delta t_{d3}$ of the first optical signal and the second optical signal arriving at second coupler 64 may satisfy $\Delta t_{d3}=0.6 \sim 1.2 \times \Delta T$ with respect to pulse width $\Delta T$ of the input signal pulse.

At this time, the phase variation of the first optical signal is such as shown by a solid line curve in FIG. 3A while the phase variation of the second optical signal is such as shown by an dot and long dash line curve in FIG. 3A, and the coupled optical signal has a pulse-like waveform similarly as in the first embodiment.

The optical signal coupled by second coupler 64 is divided at a ratio of 50:50 in optical power thereof by second divider 66. One of the optical signals divided by second divider 66 passes through polarizer 7 and phase adjuster 67 and is outputted through first signal output port 69, while the other optical signal divided by second divider 66 is outputted through second signal output port 9. It is to be noted that polarizer 7 may not necessarily be provided.

Accordingly, also the wavelength converter of the present embodiment can efficiency convert an input signal pulse of wavelength $\lambda_1$ into an output signal pulse of wavelength $\lambda_2+\Delta\lambda_S$ similarly as in the first embodiment. Further, since also the phase variation amount, the shift amount of the center wavelength and the wavelength chirping amount at this time have similar values to those in the first embodiment, the wavelength chirping of the output signal pulse can be reduced. Furthermore, also ASE noise can be reduced by using a wavelength filter having a narrow transmission band.

It is to be noted that, where an absorption type semiconductor waveguide is used for nonlinear waveguide 5, the wavelength of the output signal pulse is $\lambda_2-\Delta\lambda_S$. In this instance, the transmission center wavelength of wavelength filter 54 is set to a wavelength $(\lambda_2+\Delta\lambda_S)$ a little shorter than $\lambda_2$ in advance.

While a preferred embodiments of the present invention have been described using specific terms, such description is for illustrative purpose only, and it is to be understand that changes and variations may be made without departing from the spirit or scope of the following claims.

What is claimed is:

1. A wavelength converter for outputting an output optical signal pulse with a wavelength different from the wavelength of an input optical signal pulse, comprising:
   a first nonlinear waveguide and a second nonlinear waveguide each having a refractive index which varies in response to the input of an optical signal;
   a first optical path for conducting said input optical signal pulse to said first nonlinear waveguide;
   a second optical path for conducting said input optical signal pulse to said second nonlinear waveguide having an optical path length which causes said input optical signal pulse to arrive at said second nonlinear waveguide with a time delay corresponding to 0.6~1.2 times the pulse width of said input optical signal pulse with respect to the time said input optical signal pulse arrives at said first nonlinear waveguide;
   a third optical path for conducting continuous light of a predetermined wavelength to said first nonlinear waveguide;
   a fourth optical path for conducting said continuous light to said second nonlinear waveguide;
   a phase adjuster for adjusting the phase of an optical signal outputted from said second nonlinear waveguide to a predetermined amount with respect to the phase of said optical signal outputted from said first nonlinear waveguide;
   a coupler for coupling said optical signal outputted from said first nonlinear waveguide and said optical signal outputted from said second nonlinear waveguide; and
   a wavelength filter for removing a wavelength component of said input optical signal pulse from an optical signal outputted from said coupler.

2. A wavelength converter for outputting an output optical signal pulse with a wavelength different from the wavelength of an input optical signal pulse, comprising:
   a nonlinear waveguide having a refractive index which varies in response to the input of an optical signal;
   an optical path for conducting said input optical signal pulse to said nonlinear waveguide;
   a first optical circuit for dividing continuous light of a predetermined wavelength into a first polarized light component and a second polorized light component and conducting said first polarized light component and said second polarized light component to said nonlinear waveguide with a time delay corresponding to 0.6~1.2 times a pulse width of said input optical signal pulse;
   a second optical circuit for coupling said first polarized light component and said second polarized light component outputted from said nonlinear waveguide and causing the arrival times of said first and second polarized components at the second optical circuit to coincide;
   a phase adjuster for adjusting the phase of said second polarized light component to a predetermined amount with respect to the phase of said first polarized light component outputted from said nonlinear waveguide; and
   a wavelength filter for removing a wavelength component of said input optical signal pulse from an optical signal outputted from said second optical circuit.

3. A wavelength converter for outputting an output optical signal pulse with a wavelength different from the wavelength of an input optical signal pulse, comprising:
   a nonlinear waveguide having a refractive index which varies in response to the input of an optical signal;

an optical path for conducting continuous light of a predetermined wavelength and said input optical signal pulse to said nonlinear waveguide;

a divider for dividing an optical signal outputted from said nonlinear waveguide into a first optical signal and a second optical signal;

a phase adjuster for adjusting the phase of said second optical signal to a predetermined amount from the phase of said first optical signal;

an optical delay path for delaying said second optical signal with respect to said first optical signal by a time delay corresponding to 0.6~1.2 times the pulse width of said input optical signal pulse;

an optical coupler for coupling said first optical signal and said delayed second optical signal; and a wavelength filter for removing a wavelength component of said input optical signal pulse from an optical signal outputted from said optical coupler.

4. The wavelength converter according to claim 1, wherein said second optical path has an optical path length which causes said input optical signal pulse to arrive at said second nonlinear waveguide with a time delay corresponding to 0.89 times the pulse width of said input optical signal pulse with respect to the time said input optical signal pulse arrives at said first nonlinear waveguide.

5. The wavelength converter according to claim 2, wherein said first optical circuit conducts said first polarized light component and said second polarized light component to said nonlinear waveguide with a time delay corresponding to 0.89 times the pulse width of said input optical signal pulse.

6. The wavelength converter according to claim 3, wherein said optical delay path delays said second optical signal by a time corresponding to 0.89 times the pulse width of said input optical signal pulse with respect to said first optical signal.

7. The wavelength converter according to claim 1, wherein said first nonlinear waveguide and said second nonlinear waveguide are semiconductor optical amplifiers.

8. The wavelength converter according to claim 2, wherein said nonlinear waveguide is a semiconductor optical amplifier.

9. The wavelength converter according to claim 3, wherein said nonlinear waveguide is a semiconductor optical amplifier.

10. The wavelength converter according to claim 1, wherein said first nonlinear waveguide and said second nonlinear waveguide are absorption type semiconductor waveguides.

11. The wavelength converter according to claim 2, wherein said nonlinear waveguide is an absorption type semiconductor waveguide.

12. The wavelength converter according to claim 3, wherein said nonlinear waveguide is an absorption type semiconductor waveguide.

13. The wavelength converter according to claim 1, wherein said first nonlinear waveguide and said second nonlinear waveguide are semiconductor devices of a bulk structure.

14. The wavelength converter according to claim 2, wherein said nonlinear waveguide is a semiconductor device of a bulk structure.

15. The wavelength converter according to claim 3, wherein said nonlinear waveguide is a semiconductor device of a bulk structure.

16. A wavelength conversion method, comprising the steps of:

inputting to a first nonlinear waveguide and a second nonlinear waveguide each having a refractive index which varies in response to the input of an optical signal an input optical signal pulse together with continuous light of a predetermined wavelength through two optical paths of different lengths for causing said input optical signal pulses to have time delays corresponding to 0.6~1.2 times the pulse length of said input optical signal pulses;

adjusting the phase of an optical signal outputted from said second nonlinear waveguide to a predetermined amount with respect to the phase of an optical signal outputted from said first nonlinear waveguide;

coupling an optical signal outputted from said first nonlinear waveguide with an optical signal outputted from said second nonlinear waveguide; and causing an output optical signal pulse to be outputted with a wavelength different from said input optical signal pulse by removing wavelength components of said input optical signal pulse from said coupled optical signals.

17. A wavelength conversion method, comprising the steps of:

dividing continuous light of a predetermined wavelength into a first polarized light component and a second polarized light component;

inputting to a nonlinear waveguide having a refractive index which varies in response to an input optical signal an input optical signal pulse and inputting said first polarized light component and said second polarized light component to said nonlinear waveguide with a time delay corresponding to 0.6~1.2 times the pulse width of said input optical signal pulse;

adjusting the phase of said second polarized light component to a predetermined amount with respect to the phase of said first polarized light component outputted from said nonlinear waveguide;

coupling said first polarized light component with said second polarized light component outputted from said nonlinear waveguide and causing arrival times of said first and second polarized components at the coupling to coincide; and causing an output optical signal pulse to be outputted with a wavelength different from said input optical signal pulse by removing wavelength components of the input optical signal pulse from the coupled optical signal.

18. A wavelength conversion method, comprising the steps of:

inputting to a nonlinear waveguide having a refractive index which varies in response to the input of an input optical signal continuous light of a predetermined wavelength and an input optical signal pulse;

dividing an optical signal outputted from said nonlinear waveguide into a first optical signal and a second optical signal;

adjusting the phase of said second optical signal to a predetermined amount with respect to the phase of said first optical signal;

delaying the second optical signal by a time difference corresponding to 0.6~1.2 times the pulse width of said input optical signal pulse with respect to said first optical signal;

coupling said first optical signal with said delayed second optical signal; and causing an output optical signal pulse to be outputted with a wavelength different than that of said input optical signal pulse by removing wavelength components of the input optical signal pulse from the coupled optical signal.

19. The wavelength conversion method according to claim 16, wherein said input optical pulses are inputted in said first nonlinear waveguide and said second nonlinear waveguide through two wave paths of different wave path lengths causing said input pulses to have a time delay corresponding to 0.89 times the pulse width of said input optical signal pulse.

20. The wavelength conversion method according to claim 17, wherein said first polarized light component and said second polarized light component are inputted to said nonlinear waveguide with a time delay corresponding to 0.89 times the pulse width of said input optical signal pulse.

21. The wavelength conversion method according to claim 18, wherein said second optical signal is delayed by a time corresponding to 0.89 times the pulse width of said input optical signal pulse with respect to said first optical signal.

22. The wavelength conversion method according to claim 16, wherein semiconductor optical amplifiers are used for said first nonlinear waveguide and said second nonlinear waveguide.

23. The wavelength conversion method according to claim 17, wherein a semiconductor optical amplifier is used for said nonlinear waveguide.

24. The wavelength conversion method according to claim 18, wherein a semiconductor optical amplifier is used for said nonlinear waveguide.

25. The wavelength conversion method according to claim 16, wherein absorption type semiconductor waveguides are used for said first nonlinear waveguide and said second nonlinear waveguide.

26. The wavelength conversion method according to claim 17, wherein an absorption type semiconductor waveguide is used for said nonlinear waveguide.

27. The wavelength conversion method according to claim 18, wherein an absorption type semiconductor waveguide is used for said nonlinear waveguide.

28. The wavelength conversion method according to claim 16, wherein semiconductor devices of a bulk structure are used for said first nonlinear waveguide and said second nonlinear waveguide.

29. The wavelength conversion method according to claim 17, wherein a semiconductor device of a bulk structure is used for said nonlinear waveguide.

30. The wavelength conversion method according to claim 18, wherein a semiconductor device of a bulk structure is used for said nonlinear waveguide.

* * * * *